US007596022B2

(12) United States Patent
Chae et al.

(10) Patent No.: US 7,596,022 B2
(45) Date of Patent: *Sep. 29, 2009

(54) METHOD FOR PROGRAMMING A MULTI-LEVEL NON-VOLATILE MEMORY DEVICE

(75) Inventors: Dong-Hyuk Chae, Seoul (KR); Dae-Seok Byeon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 15 days.

This patent is subject to a terminal disclaimer.

(21) Appl. No.: 11/848,014

(22) Filed: Aug. 30, 2007

(65) Prior Publication Data
US 2008/0089123 A1 Apr. 17, 2008

(30) Foreign Application Priority Data
Sep. 6, 2006 (KR) ...................... 10-2006-0085880

(51) Int. Cl.
G11C 16/04 (2006.01)
(52) U.S. Cl. .............................. 365/185.03; 365/185.18
(58) Field of Classification Search ............ 365/185.03, 365/185.18, 185.2, 185.22, 185.23, 219
See application file for complete search history.

(56) References Cited

U.S. PATENT DOCUMENTS

| 5,299,162 | A | 3/1994 | Kim et al. |
| 5,831,900 | A * | 11/1998 | Miyamoto ............. 365/185.03 |
| 6,414,893 | B1 * | 7/2002 | Miyamoto .................. 365/219 |
| 6,456,528 | B1 | 9/2002 | Chen |
| 6,859,397 | B2 | 2/2005 | Lutze et al. |
| 6,958,934 | B2 | 10/2005 | Fan et al. |
| 7,120,052 | B2 | 10/2006 | Shibata et al. |
| 2006/0104120 | A1 | 5/2006 | Hemink |
| 2008/0084739 | A1 * | 4/2008 | Chae et al. ............. 365/185.03 |
| 2008/0144380 | A1 * | 6/2008 | Youn et al. ............. 365/185.09 |
| 2008/0189473 | A1 * | 8/2008 | Murray ....................... 711/103 |

OTHER PUBLICATIONS

Ken Takeuchi, et al., "A Multipage Cell Architecture for High-Speed Programming Multilevel NAND Flash Memories," pp. 1228-1238, IEEE Journal of Solid-State Circuits, vol. 33, No. 8, Aug. 1998.
Taehee Cho, et al., "A Dual-Mode NAND Flash Memory: 1Gb Multilevel and High-Performance 512-Mb Single-Level Modes," pp. 1700-1706, IEEE Journal of Solid-State Circuit, vol. 36, No. 11, Nov. 2001.

* cited by examiner

Primary Examiner—Gene N. Auduong
(74) Attorney, Agent, or Firm—F. Chau & Associates, LLC

(57) ABSTRACT

A method for programming multi-level non-volatile memory. A plurality of multi-bit storage cells capable of storing different levels of charge usable to represent data represented by a least significant bits (LSBs) and a most significant bits (MSBs) are programmed first with LSBs and then with MSBs. The programmed storage cells have a threshold voltage lower than a voltage VR1 to store a first value, greater than VR1 and lower than a voltage VR2 to store a second value, and greater than VR2 and lower than a voltage VR3 to store a third value. Each of the cells has a threshold voltage greater than a voltage VR3 when it is desired that the storage cell store a fourth value. VR1 is less than VR2 which is less than VR3. The flag cell is programmed to have a threshold voltage greater than VR3 to indicate that the MSBs have been programmed.

28 Claims, 11 Drawing Sheets

Fig. 13

| | Erase | Program | Program Inhibition | Read Data '10' @ LSB page | Verify Data '10' @ LSB page | Read Data '10' @ MSB page | Verify Data '10' @ MSB page | Read Data '00' | Verify Data '00' | Read Data '01' | Verify Data '01' | Read Flag Cell Data |
|---|---|---|---|---|---|---|---|---|---|---|---|---|
| BLe | Floating | 0V | Vcc | H or L | H or L | H or L | H or L | H or L | H or L | H or L | H or L | H or L |
| BLo | Floating | Vcc | Vcc | 0V | 0V | 0V | 0V | 0V | 0V | 0V | 0V | 0V |
| SSL | Floating | Vcc | Vcc | Vread | Vread | Vread | Vread | Vread | Vread | Vread | Vread | Vread |
| Sel WL | 0V | Vpgm | Vpgm | VR1 (0V) | VF2* (<VF2) | VR2 (1V) | VF2 | VR3 (2V) | VF3 | VR1 (0V) | VF1 | VR1 or VR2 |
| Unsel WLs | 0V | Vpass | Vpass | Vread | Vread | Vread | Vread | Vread | Vread | Vread | Vread | Vread |
| GSL | Floating | 0V | 0V | Vread | Vread | Vread | Vread | Vread | Vread | Vread | Vread | Vread |
| CSL | Floating | 0V | 0V | 0V | 0V | 0V | 0V | 0V | 0V | 0V | 0V | 0V |
| Bulk | 20V | 0V | 0V | 0V | 0V | 0V | 0V | 0V | 0V | 0V | 0V | 0V |

METHOD FOR PROGRAMMING A MULTI-LEVEL NON-VOLATILE MEMORY DEVICE

BACKGROUND

REFERENCE TO RELATED APPLICATION

The present application claims priority to Korean Patent Application 10-2006-0085880, filed Sep. 6, 2006, the entire contents of which are herein incorporated by reference.

TECHNICAL FIELD

The present disclosure relates to a non-volatile memory device and, more specifically, to a method for programming a multi-level non-volatile memory device.

DESCRIPTION OF THE RELATED ART

Flash memory is a form of computer memory that can retain data without having to consume power and is thus characterized as non-volatile. Flash memory may be programmed and erased in blocks.

Flash memory stores data in an array of floating gate transistors called cells. In single-level flash memory, one bit of data may be stored in each cell. In multi-level flash memory, more than one bit of data may be stored in each cell by differentiating between several levels of charge that may be stored in the floating gate of the cell.

FIG. 1 is a schematic diagram showing a single cell 10 of flash memory. Flash memory is comprised of a p-type semiconductor substrate 11 that may be doped, for example with boron ions. An n-type source region 12 and an n-type drain region 13 may be formed within the substrate 11 by dropping, for example, with phosphorus arsenic, or antimony ions. A floating gate 14 may be formed above the substrate 11 and may be insulated from the substrate. A control gate 15 may be formed above the floating gate 14 and may be insulated from the floating gate 14. Because the floating gate 14 is completely insulated, charge that may be stored within the floating gate is trapped and thus data may persist in the floating gate without the consumption of electricity.

Flash memory may be either NOR memory or NAND memory. Each form of flash memory has its own set of characteristics. For example, NOR flash utilizes a process called hot electron injection to trap charge within the floating gate and relies on quantum tunneling to discharge the floating gate. NAND flash utilizes quantum tunneling both to trap charge and discharge.

A NAND flash memory device may be organized into strings. FIG. 2 shows an example of a string of NAND flash memory. The illustrated string is depicted physically 200A and in terms of its analogous electrical schematic 200B. Each string is a group of cells connected in series. Each string may comprise, for example, 16 or 32 cells. Each string may have a bit line with a bit tine contact 210 and one or more gates for controlling the string. For example, each string may have a select gate 220 and a control gate 230. The string may also have a floating gate 240 and a cell source line 250.

Multiple strings may be connected to form a page. Word lines may connect analogous cells in each string of the page. Multiple pages may be organized into blocks. FIG. 3 shows an example of a flash memory block. The flash memory 100 has an X-Decoder 130 that controls voltages of the word lines (WL), the string select line (SSL) and the ground source line (GSL). The flash memory 100 also has a page buffer circuit 150 for controlling voltages of the bit lines (BL). The flash memory 100 is organized as a block 110 made up of strings. In FIG. 3, strings 110_1, 110_2, and 110_M are shown, however, it is to be understood that there may be any number of strings between 110_2 and 110_M. Here, string 110_1 has a bit line "BLe" and string 110_2 has a bit line "BLo". The flash memory 100 is also organized into pages. An example of a page is shown as 110p.

Each string may be connected to a string selection line (SSL), a ground selection line (GSL), a series of word lines (WL) numbered WL<N−1> through WL<0>, and a common source line (CSL), and each string may have a string selection transistor (SST), a ground select transistor (GST) and a series of memory cell transistors (MCT) numbered MCT<N−1> through MCT<0>.

In the flash memory device, the presence and degree of charge within the floating gate affects the threshold voltage of the cell. The threshold voltage of the cell may be understood to be the minimum voltage that need be applied to the control gate before current may begin to flow between the source and drain. Accordingly, the cell may be read by applying a predetermined voltage to the control gate and determining whether current may flow between the source and drain. In practice sense amplifiers may be used to detect and amplify observed current flow.

In a multi-level flash, multiple discrete levels of charge may be stored within the floating gate of the cell. For example, in a 2-bit multi-level flash, there may be four discrete levels of charge that may be stored within the floating gate of the cell. In this case, the cell may exhibit one of four distinct threshold voltages depending on the level of charge trapped in the floating gate. The level of charge stored in the cell, and hence the stored data value, may be determined by applying a test voltage to the control gate and determining whether current flows. For a 2-bit multi-level flash, it may be necessary to test whether current flows at up to 3 discrete read voltages to determine the state of the cell.

Multi-level flash may have more than 2-bits. For examples a multi-level flash may have 3 or more bits. A 3-bit flash would have 8 ($2^3$) states per cell, a 4-bit flash would have 16 ($2^4$) states per cell, a 5-bit flash would have 32 ($2^5$) states per cell, etc. The operative threshold levels of such multi-level flash would have to be set over the range of possible values and adjacent threshold ranges may be separated by margins. Accordingly, flash having higher number of bits must be able to set charge levels within narrower ranges and have narrower margins. To accommodate these narrower ranges and margins, charge must be added to cells with increased precision. The process of adding charge to cells is referred to as "programming." Accordingly, programming for multi-level flash requires increased precision.

SUMMARY

A method for programming multi-level non-volatile memory. A plurality of multi-bit storage cells capable of storing different levels of charge usable to represent data represented by least significant bits (LSBs) and most significant bits (MSBs) are programmed first with LSBs and then with MSBs. Each of the programmed storage cells has a threshold voltage lower than a voltage VR1 when it is desired that the storage cell store a first value. Each of the cells has a threshold voltage greater than the voltage VR1 and lower than a voltage VR2 when it is desired that the storage cell store a second value. Each of the cells has a threshold voltage greater than the voltage VR2 and lower than a voltage VR3 when it is desired that the storage cell store a third value. Each of the cells has a threshold voltage greater than a voltage VR3 when it is desired that the storage cell store a fourth value. The voltage VR1 is less than VR2 which is less than VR3. The flag cell is programmed to have a threshold voltage greater than the voltage VR3 to indicate that the MSBs have been programmed.

A controller for controlling memory according to a method for programming multi-level non-volatile memory comprising at least one flag cell and a plurality of multi-bit storage cells. Each of the plurality of multi-bit storage cells is capable of storing different levels of charge usable to represent data. The data is represented by least significant bits (LSBs) and a most significant bits (MSBs). The method includes programming the storage cells first with LSBs and then with MSB data. Each of the programmed storage cells has a threshold voltage lower than a voltage VR1 when it is desired that the storage cell store a first value. Each of the cells has a threshold voltage greater than the voltage VR1 and lower than a voltage VR2 when it is desired that the storage cell store a second value. Each of the cells has a threshold voltage greater than the voltage VR2 and lower than a voltage VR3 when it is desired that the storage cell store a third value. Each of the cells has a threshold voltage greater than a voltage VR3 when it is desired that the storage cell store a fourth value. The voltage VR1 is less than VR2 which is less than VR3. The flag cell is programmed to have a threshold voltage greater than the voltage VR3 to indicate that the MSB data have been programmed.

A method for programming a multi-level non-volatile memory comprising at least one flag cell and a plurality of multi-bit storage cells. Each of the plurality of multi-bit storage cells is capable of storing different levels of charge usable to represent data. The data is represented by a plurality of data pages. The method includes sequentially programming one or more of the plurality of data pages such that each of the programmed storage cells has a threshold voltage within one of a plurality of threshold voltage ranges comprising a first range and a plurality of subsequent ranges. Each of the plurality of subsequent ranges is defined as being equal to or greater than a respective verify voltage. Each of the plurality of subsequent ranges is read at a respective read voltage. For each given subsequent range, the respective read voltage is less than the respective verify voltage by a margin M. The at least one flag cell is programmed to a threshold voltage within a threshold voltage range indicative of the number of data pages that have been programmed. The flag cell threshold voltage range is defined as being equal to or greater than a flag cell verify voltage. The flag cell is read at a flag cell read voltage. The flag cell read voltage is less than the flag cell verify voltage by an enhanced margin $M_{enhanced}$ that is larger than the margin M.

A controller for controlling memory according to a method for programming multi-level non-volatile memory comprising at least one flag cell and a plurality of multi-bit storage cells. Each of the plurality of multi-bit storage cells is capable of storing different levels of charge usable to represent data. The data is represented by a plurality of data pages. The method includes sequentially programming one or more of the plurality of data pages such that each of the programmed storage cells has a threshold voltage within one of a plurality of threshold voltage ranges comprising a first range and a plurality of subsequent ranges. Each of the plurality of subsequent ranges is defined as being equal to or greater than a respective verify voltage. Each of the plurality of subsequent ranges is read at a respective read voltage. For each given subsequent range, the respective read voltage is less than the respective verify voltage by a margin M. The at least one flag cell is programmed to a threshold voltage within a threshold voltage range indicative of the number of data pages that have been programmed. The flag cell threshold voltage range is defined as being equal to or greater than a flag cell verify voltage. The flag cell is read at a flag cell read voltage. The flag cell read voltage is less than the flag cell verify voltage by an enhanced margin $M_{enhanced}$ that is larger than the margin M.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIG. 13 is a table showing bias conditions for controlling a two-bit multi-level non-volatile memory device according to an exemplary embodiment of the present invention;

DETAILED DESCRIPTION

Figure 1:
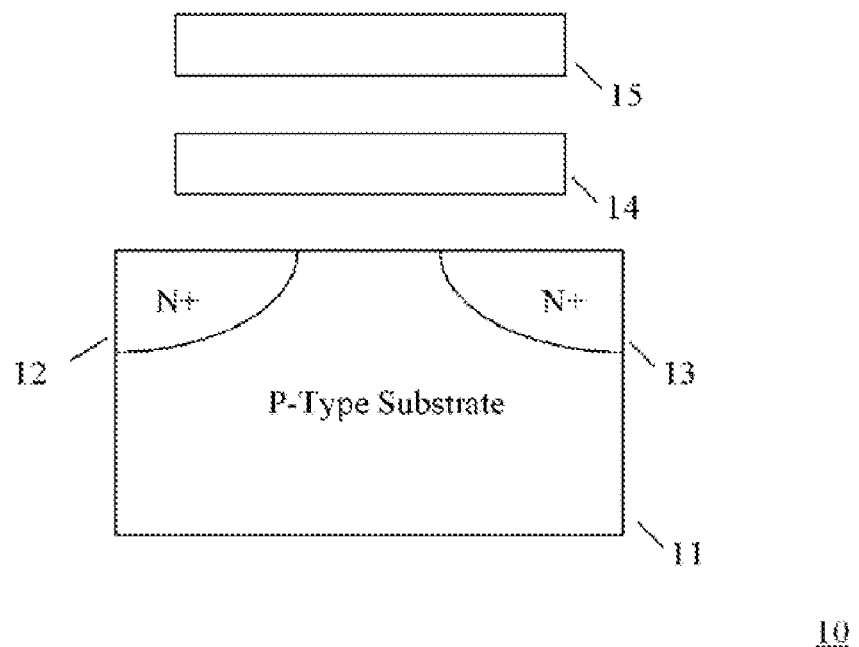
FIG. 1 is a schematic diagram showing a single cell of flash memory.
Figure 2:
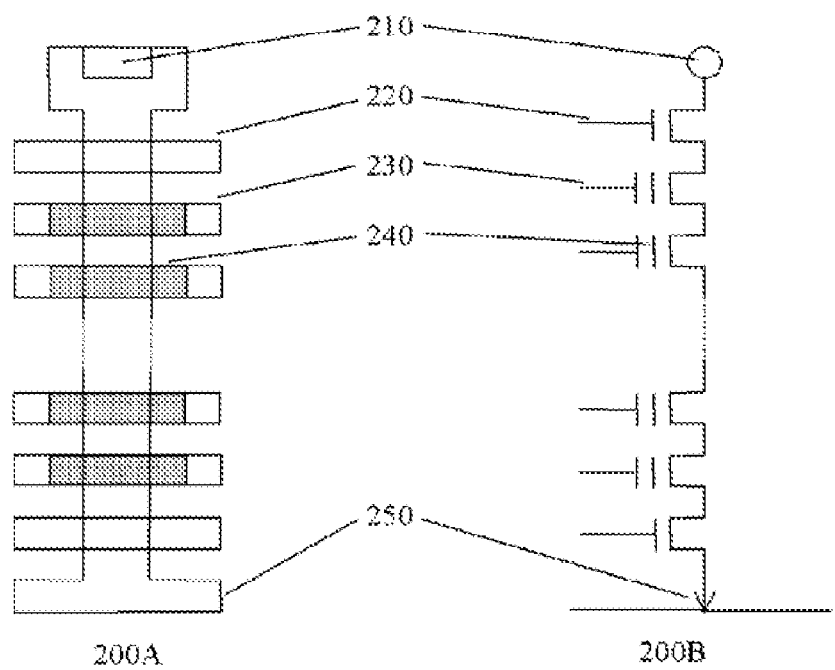
FIG. 2 shows an example of a string of NAND flash memory.
Figure 3:
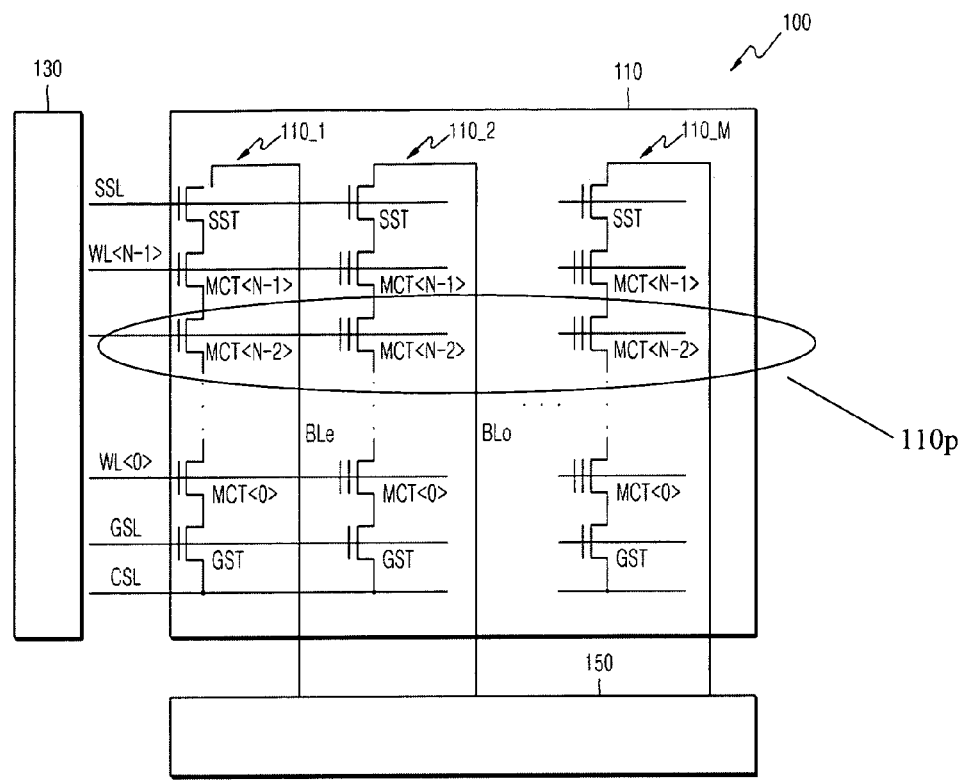
FIG. 3 shows an example of a flash memory block.

In describing the preferred embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Embodiments of the present invention may allow for high-precision programming of cells within a multi-level non-volatile memory device, for example, a flash memory having two or more bits.

Figure 4:
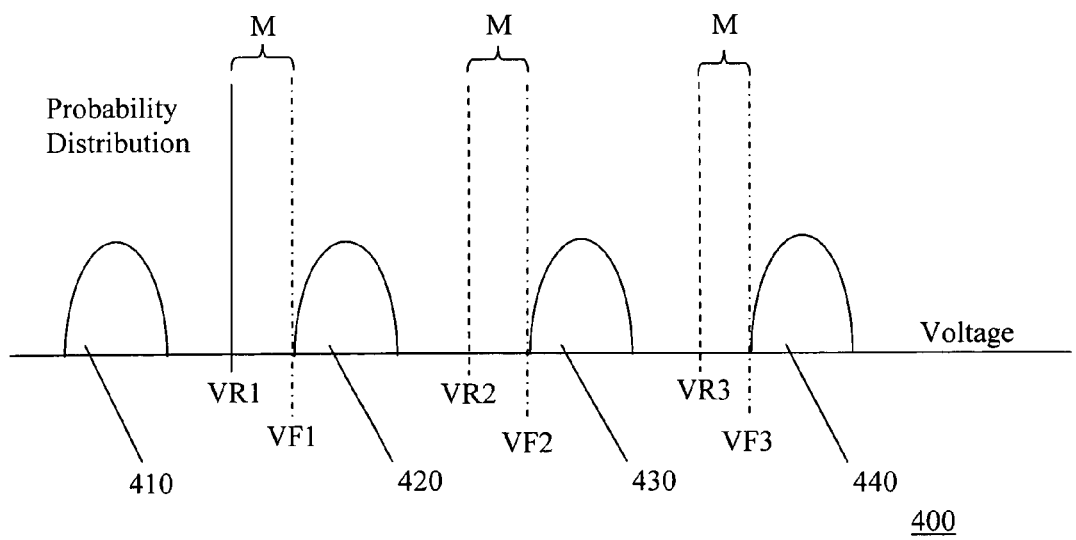
FIG. 4 illustrates the four states of a 2-bit multi-level flash according to an exemplary embodiment of the present invention.

FIG. 4 illustrates the four states of a 2-bit multi-level flash. In this graph 400, the x-axis represents threshold voltage while the y-axis represents the probability distribution for the threshold voltage of a particular programmed cell. The threshold voltage of the cell is represented as a probability distribution and thus the cell's charge states are represented as a curve showing the likelihood that the cell programmed according to a particular state would have a particular threshold value.

A given cell may have one of the four possible threshold voltage probability curves 410, 420, 430, 440 representative of a first state, a second state, a third state and a fourth state respectively. In the ideal case, a cell having the threshold voltage probability curve 410 will not register a current at any of test voltages VR1, VR2, and VR3. A cell having the threshold voltage probability curve 420 will register a current at VR1 but not at VR2 or VR3. A cell having the threshold voltage curve 430 will register a current at VR1 and VR2 but not at VR3. A cell having the threshold voltage curve 440 will register a current at all test voltages VR1, VR2, and VR3. Accordingly, in the ideal case, it is possible to distinguish between four states by reading the cell at each of 3 voltages VR1, VR2, and VR3.

It may also be desirable to leave a margin between the threshold voltage ranges 420, 430, and 440 and the measurement voltages VR1, VR2, and VR3 respectively. These margins are shown as the distance M and extend from the measurement voltage and the adjacent verify voltage VF1, VF2, and VF3 which indicates the start of the threshold voltage ranges 420, 430, and 440.

While the exact threshold voltage ranges may be selected according to design and manufacturing constraints, specific voltages may be provided herein solely as an example, and it is contemplated that the states of the cell may be set according to any voltage scale. For example, the first state 410 may be represented by a cell having a threshold voltage less than approximately −2 Volts. The second state 420 may be represented by a cell having a threshold voltage within the range of 0.3 to 0.7 Volts. The third state 430 may be represented by a cell having a threshold voltage within the range of 1.3 to 1.7 Volts. The fourth state 440 may be represented by a cell having a threshold voltage within the range of 2.3 to 2.7 Volts.

As discussed above, as the number of possible memory states of a cell increases, the ranges of threshold voltages that correspond to a given state become more narrow as do the margins that separate the threshold voltages from the measurement voltages. Accordingly, it is increasingly important to program each cell with a high degree of precision.

Figure 5:
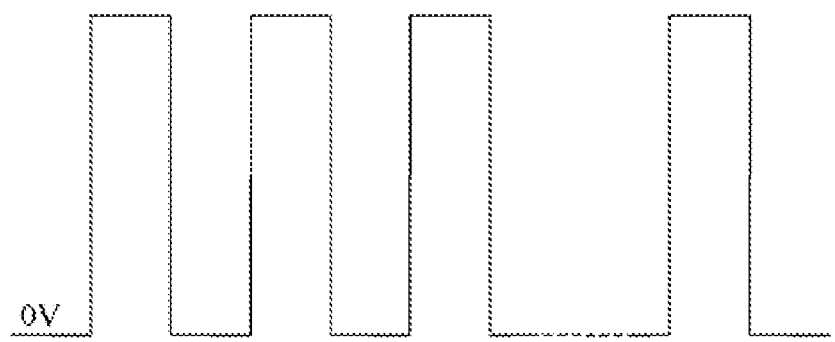
FIG. 5 illustrates an exemplary electrical signal used as part of a method of ISPP ention.

One method for increasing programming precision is Incremental Step Pulse Programming (ISIPP). FIG. 5 shows an exemplary wave form useable for ISPP.

Figure 6:
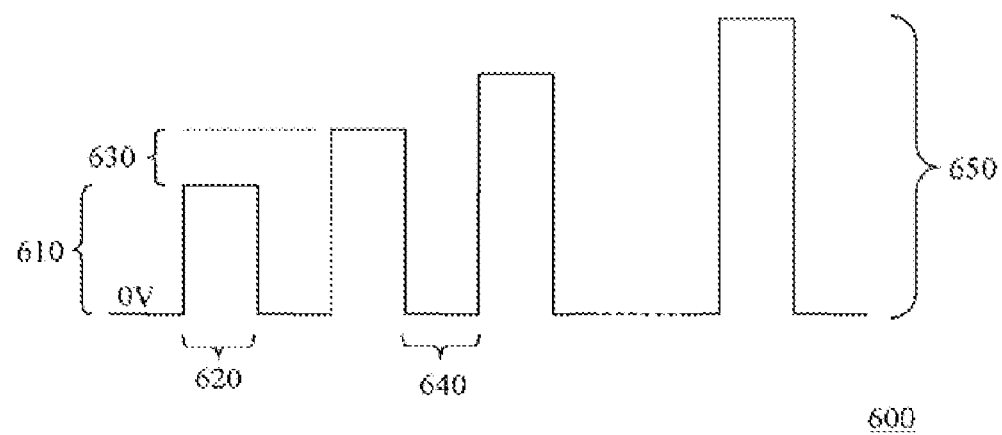
FIG. 6 illustrates an electrical signal used as part of a method of ISPP according to another exemplary embodiment of the present invention.

FIG. 6 shows a waveform for ISPP according to an exemplary embodiment of the present invention. The use of the waveform shown in FIG. 6 facilitates smaller cell threshold voltage variations than the use of the waveform shown in FIG. 5. Here, the electrical signal 600 (Vpgm) comprises a series of pulses with each pulse extending for a length of time constituting a program period 620. Each pulse may be separated by a length of time constituting a verify period 640. The voltage of each successive pulse may increase, for example, by a voltage 630 (ΔVpgm), which may be, for example, 0.5V. For example, the voltage of the first pulse 610 may be 15V. Each successive pulse may increase up to and including a maximum voltage 650 which may be, for example, 19V. The threshold voltage of the cell may be tested, for example, between each pulse or periodically, for example, every 3 pulses, to see if the proper threshold voltage has been achieved. If it has not been achieved, additional pulses may be applied.

After the cell has been programmed, the cell may be read to verify that the cell has been properly programmed. For example, the threshold voltage may be tested to see if it has been set sufficiently high. If it has not been, additional pulses may be applied until the threshold voltage is sufficiently high.

A set of verification test voltages may be used to verify the programmed threshold voltages. The verification voltages (VF) may be different than the test voltages used to read the cells (VR). For example, the verification voltages VF1, VF2, VF3 may each be greater than the corresponding read voltages VR1, VR2, VR3 by the amount of the margin M discussed above.

Figure 7:
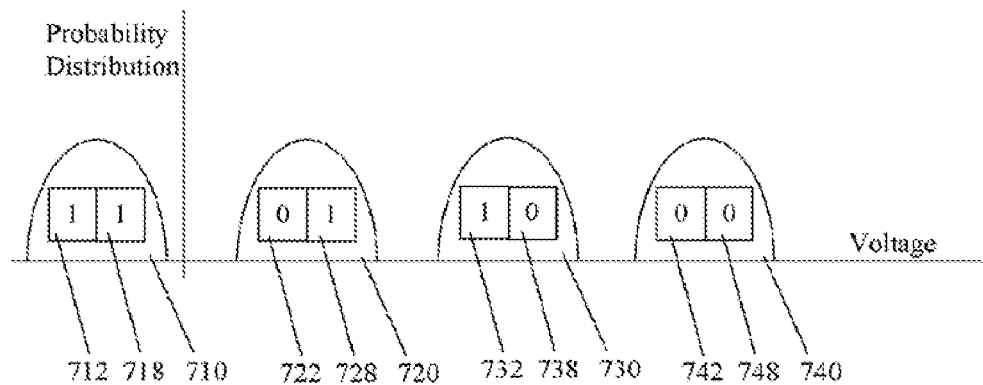
FIG. 7 illustrates the four possible states of a 2-bit memory according to an exemplary embodiment of the present invention.

Each cell state of a multi-bit memory device may be represented by a number. For example, where a 2-bit flash is used, each of the four possible states may be expressed by a 2-bit binary number. For example, the first unprogrammed state may be expressed as "11," the second state may be expressed as "01," the third state may be expressed as "10," and the fourth state may be expressed as "00." FIG. 7 illustrates the four possible states of a 2-bit memory according to an embodiment of the present invention. It should be understood that the nomenclature may be arbitrary and the present nomenclature is offered as an example. Here, the threshold voltage probability distribution 700 for each of the four states is shown. It is to be understood that a given cell may only have one threshold voltage at a time and the threshold voltage may be within one of the 4 states, with the exact threshold voltage falling within the distribution for that state in accordance with the probability curve.

Each 2-bit binary number may be said to include a most significant bit (MSB) and a least significant bit (LSB). In the first unprogrammed state 710, the MSB 712 is "1" and the LSB 718 is "1." In the second state 720, the MSB 722 is "0" and the LSB 728 is "1." In the third state 730, the MSB 732 is "1" and the MSB 738 is "0." In the fourth state 740, the MSB 742 is "0" and the LSB 748 is "0."

As discussed above, data may be stored in each cell by trapping a level of charge in the floating gate necessary to achieve a threshold voltage within a desired range, with each range representing a state. Accordingly, data may be stored in the cell by programming the cell and in the case of a 2-bit memory, 2-bits of data may be stored in each cell. When desired, 2-bit memory cells may be programmed with only a single bit of data. Similarly, a cell programmed with only a first bit of data may be later programmed with a second bit of data. When only a single bit of data is programmed in a cell, the cell is said to contain only LSB data. When 2-bits of data are programmed in a cell, the cell is said to contain both LSB data and MSB data. It may be desirable, and in some cases necessary, to first program (and verify) LSB data within a cell and then to program (and verify) MSB data within the cell. It should be understood that in NAND flash memory, cells may be programmed one page at a time. Accordingly, the LSB cells of a physical page may be considered an LSB logical page and the MSB cells of the physical page may be considered an MSB logical page wherein the process of programming a physical page includes first programming (and verifying) the LSB logical page and next programming (and verifying) the MSB logical page.

Figure 8:
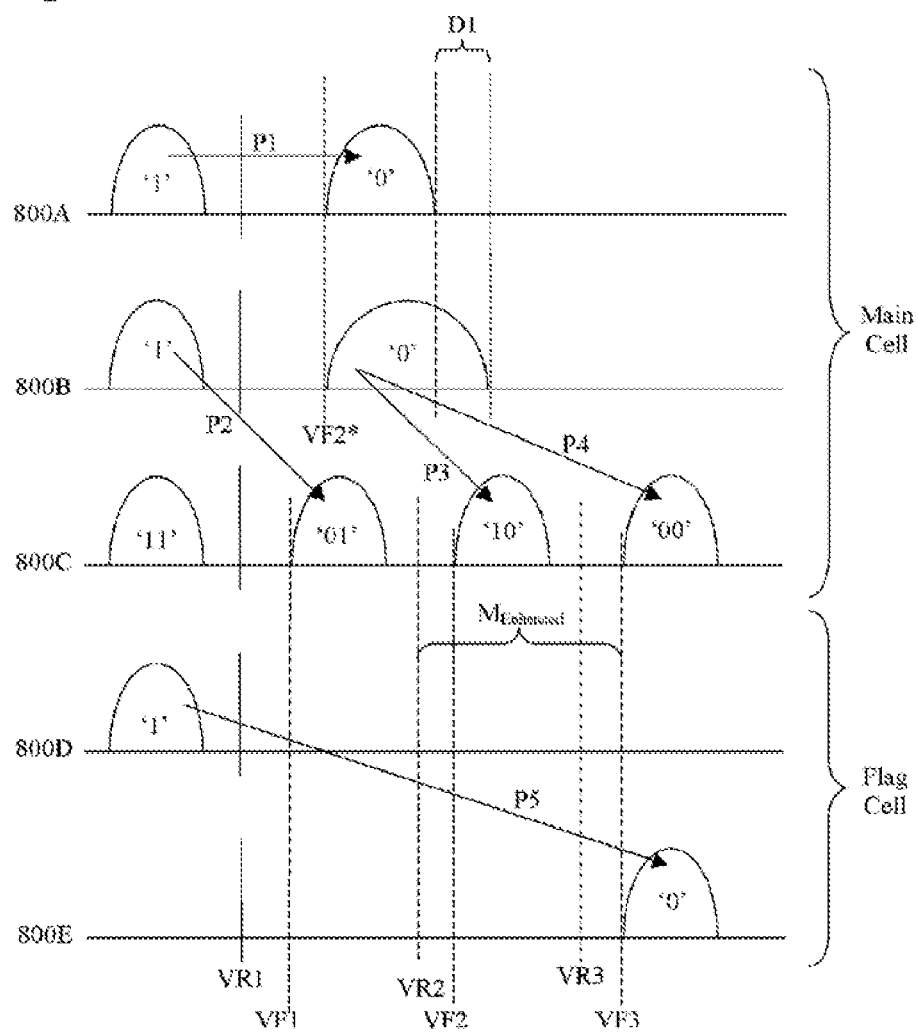
FIG. 8 illustrates a method for programming data in a cell according to an exemplary embodiment of the present invention.

FIG. 8 illustrates a method for programming data in a cell according to an exemplary embodiment of the present invention. L in 800A represents a cell where only LSB data has been programmed. The unprogrammed state of LSB data is "1." When it is desired that a "0" be stored, the cell is programmed until the threshold voltage is verified to be within the appropriate range of the "0" state (greater than VF2*). Such a programming step is illustrated as P1.

When only LSB data is stored in a cell, the cell may be read at a single voltage, here shown as VR1. If at voltage VR1, current can be observed, then the cell is determined to be in the unprogrammed "1" state. If at voltage VR1, no current can be observed, then the cell is determined to be in the "0" state.

At least partly because of the close proximity of adjacent cells, the programming of adjacent cells may affect the threshold voltage for a given cell in a phenomenon identified as the coupling effect. Because of this potential for change in threshold voltage of the affected cell, the probability curve may widen. Line 800B represents the cell where only LSB data has been programmed and the threshold voltage probability curve has widened by an amount D1.

When the MSB page is programmed after the LSB page is programmed, as is the case with some exemplary embodiments of the present invention, the "1" LSB data state of line 800B may remain as the "11" data state of line 800C or may be programmed until the threshold voltage is verified to be within the appropriate range of the "01" state of line 800C (greater than VF1) through a programming step shown as P2. Similarly, the "0" data state of line 800B may be programmed until the threshold voltage is verified to be within the appropriate range of the "10" state of line 800C (greater than VF2) through a programming step shown as P3 or it may be programmed until the threshold voltage is verified to be within the appropriate range of the "00" data state of line 800C (greater than VF3) through a programming step shown as P4. Each programming step may utilize an ISPP process, for example, the ISPP processes described above.

When reading data from the memory device, it may be necessary to know whether only LSB data have been stored or whether both LSB data and MSB data have been stored. There are many reasons why this information should be known. For example, reading only LSB data only requires reading at one voltage (VR1) while reading LSB and MSB data requires reading at three voltages (VR1, VR2, and VR3) as discussed above. Additionally, as shown in line 800B, the "0" state of LSB data may include threshold voltages on either side of the VR2 voltage.

VF1 is greater than VR1 by a margin M. Similarly, VF2 is greater than VR2 by a margin M and VF3 is greater than VR3 by a margin M. All margins M may be the same; however, this is not required. Allowing a margin may improve read accuracy.

Embodiments of the present invention may utilize a cell referred to as an MSB flag to indicate whether MSB data has been stored. Where a cell of a storage device is dedicated as an MSB flag cell, the remaining cells may be referred to as data storage cells. At a later point when reading of the stored data is desired, the MSB flag cell may be read to allow for an accurate interpretation of the stored data regardless of whether only LSB data have been stored or whether both LSB and MSB data have been stored. There may be at least one MSB flag cell for each page indicating whether MSB data has been stored to that page.

Line 800D illustrates an MSB flag cell in the unprogrammed "1" state. This state may be used to indicate that MSB data has not been programmed. Line 800E illustrates an MSB flag cell in the "0" state. This state may be used to indicate that MSB data has been programmed. The MSB flag may begin in the "1" state and may be programmed until the threshold voltage is verified to be in the "0" state (greater than VF3) by a programming step P5 to indicate that MSB data has been programmed.

As discussed above, the "0" state of the MSB flag may be programmed until the threshold voltage of the MSB flag cell is greater than VF3. While the threshold voltage of this state is greater than VR3 by the margin M, the MSB flag is read from VR2 to provide an enhanced margin. This enhanced margin is illustrated as $M_{Enhanced}$.

A phenomenon referred to as charge loss may occur as charge unintentionally escapes from the floating gate of a cell. Charge may unintentionally escape due to defects in the insulation layer or some other factor. Loss of charge may result in the possibility that the threshold voltage can become lower than is desired. This possibility may be represented by a spreading of the probability curve in the lower-voltage direction.

While charge loss may occur at any cell, storage cells tend to have a greater level of error correction measures than the MSB flag cell. Additionally, charge loss in one storage cell may render only the affected cell unreadable, while charge loss in the MSB flag cell may render an entire page unreadable. Accordingly charge loss in the MSB flag cell may be especially problematic.

For at least this reason, the enhanced margin $M_{Enhanced}$ may be great enough to allow for an accurate read of the MSB flag cell even if charge is lost from the floating gate of the MSB flag cell. According to one embodiment of the present invention, the distance $M_{Enhanced}$ may be sufficient to place the "0" state of the MSB flag at the same distribution curve as the "00" state of the storage cell (shown as "00" on line 800C). By defining the "0" state of the MSB flag cell accordingly, the MSB flag cell may be accurately read even in less-than ideal conditions.

Figure 9:
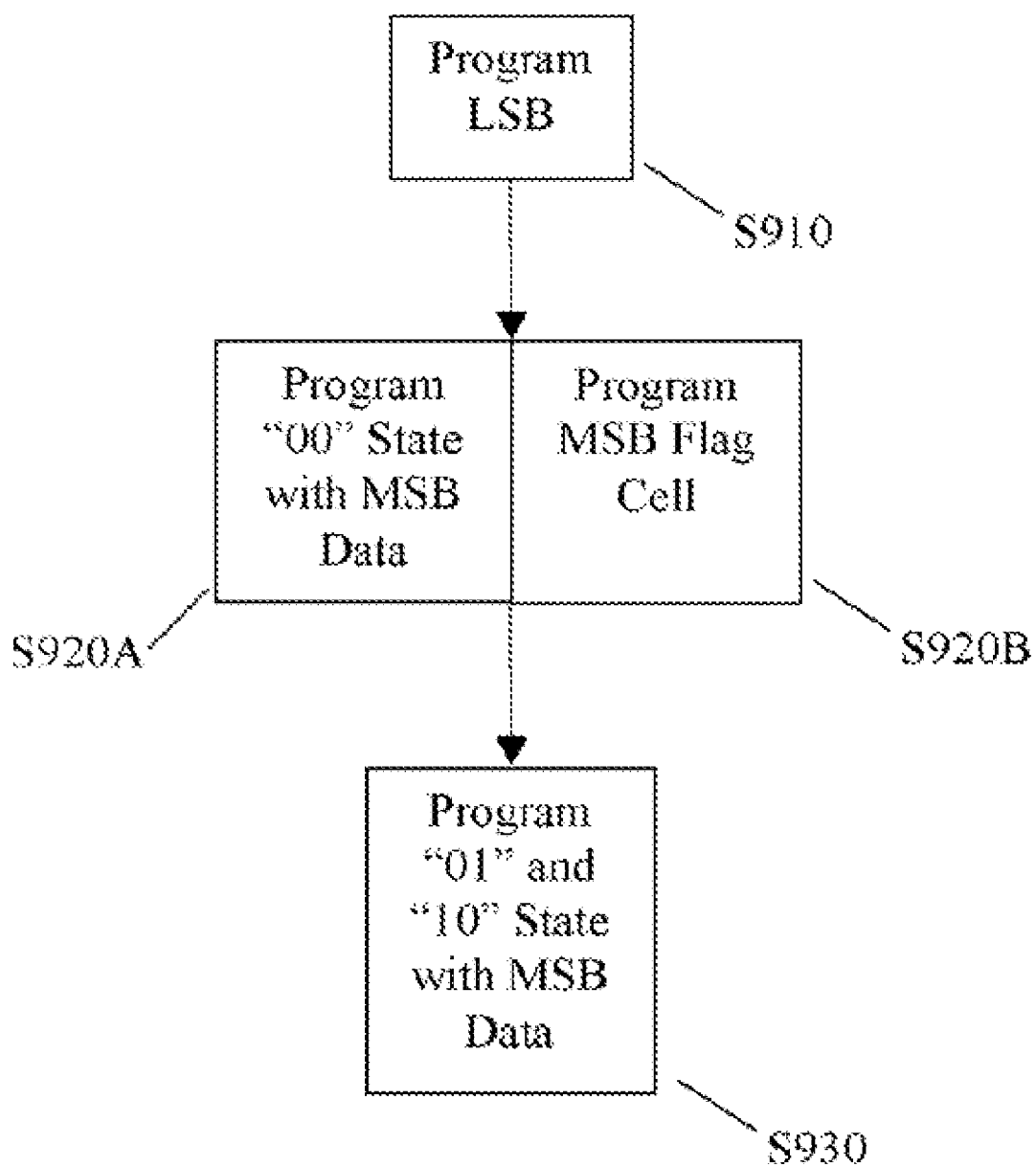
FIG. 9 illustrates a method for programming a multi-level non-volatile memory device according to an exemplary embodiment of the present invention.

FIG. 9 illustrates a method for programming a multi-level non-volatile memory device according to an exemplary embodiment of the present invention. First, the LSB data of the storage cells may be programmed (Step S910). As discussed above, the LSB logical page may be programmed by employing an ISPP process until the threshold voltage is verified as being greater than VF2* where a '0' state is desired. If the '1' state is desired than no programming is necessary at this step. Next MSB data may be used to program the "00" state, where desired, (Step S920A) by employing the ISPP process until the threshold voltage is verified as being greater than VF3. This programming step may include implementing an ISPP process to add additional charge to the "0" LSB state. The MSB flag cell may be programmed from the non-programmed state "1" to the programmed state "0" (Step S920B) to indicate that MSB data has been programmed. This programming step may include implementing an ISPP process to add additional charge to the "1" state to achieve the "0" state. As described above, the "0" state for the MSB flag cell may be programmed until the threshold voltage is verified as being greater than VR3. Steps S920A and S920B may be simultaneously executed as they may both use the same VR3 verification voltage. Next, the MSB data may be used to program the "01" and "10" states (Step S390) where desired. This programming step may include implementing an ISPP process to add additional charge to the "1" and "0" states to achieve the "01" and "10" states respectively by programming the threshold voltage is verified as being greater than VF1 and VF2 respectively. The "11" state may be achieved by leaving the cell in its unprogrammed "1" state.

However, a problem may arise if the above writing process is prematurely ended, for example, if power is interrupted during the programming of the "00" state with MSB data (Step S920A) and the programming of the MSB flag cell (Step S920B). In such an event, while LSB data may be potentially readable, MSB data would not be readable and yet the state of the MSB flag cell may not be clearly identifiable. Because of the ambiguous state of the MSB flag cell, the LSB data may be rendered unreadable.

Exemplary embodiments of the present invention discussed below concern both approaches to programming main memory cells and approaches to programming flag cells when programming main memory cells. It is to be understood that the approaches to programming main memory cells discussed below and the approaches to programming flag cells discussed below are not interdependent and do not require that the specific approaches be combined in the manner shown. Particularly, the approaches to programming main memory cells discussed below may be combined with other approaches to programming flag cells not discussed below but known in the art while the approaches to programming flag cells discussed below may be combined with other approaches to programming main memory cells not discussed below but known in the art.

Figure 10:
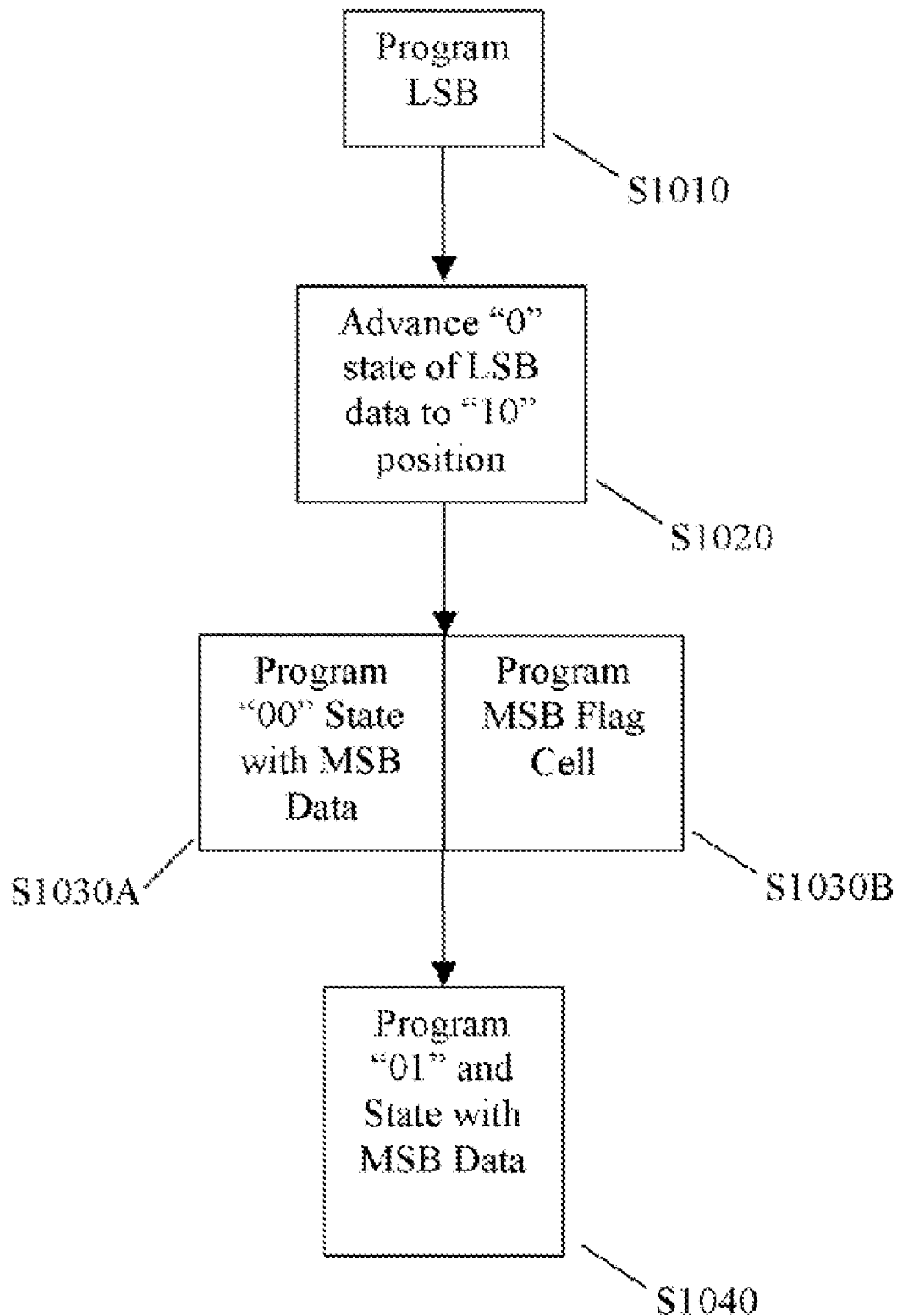
FIG. 10 illustrates a method for programming a multi-level non-volatile memory device according to an exemplary embodiment of the present invention.
Figure 11:
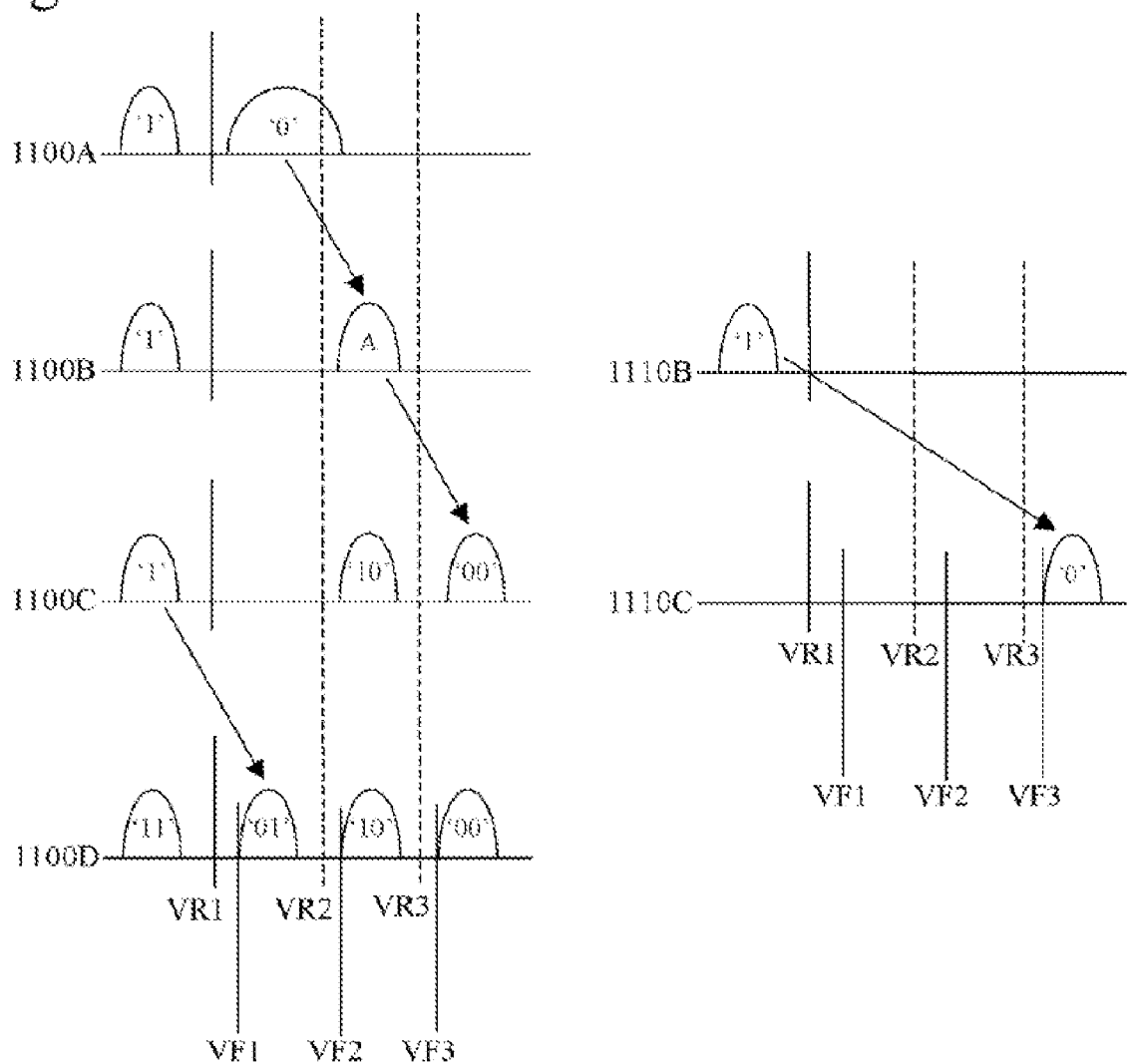
FIG. 11 illustrates a method for programming a multi-level non-volatile memory device according to an exemplary embodiment of the present invention.

Accordingly, FIGS. 10 and 11 illustrate an alternative method for programming a multi-level non-volatile memory device according to another exemplary embodiment of the present invention. First, LSB data may be programmed in the manner discussed above (Step S1010) (Line 1100A). Next, the '0' state may be advanced to the advanced state "A" by programming the cell until the threshold voltage is verified as being greater than VF2 (Step S1020) (Line 1100B). The state defined by programming to VF2 is also defined as the '10' state, however, this step may be performed when either the '10' state or the '00' state is desired. The MSB flag cell may remain unprogrammed at this step (1110B). Next, the '00' state may be programmed, if desired, by programming the A state until the threshold voltage is verified as being greater than VF3 or where the '10' state is desired, no additional programming need occur (Step S1030A) (Line 1100C). The MSB flag may be programmed at this point by programming the MSB flag cell until the threshold voltage is verified as being greater than VF3 (Step S1030B) (Line 1100C), Steps S1030A and S1030B may be executed simultaneously or near simultaneously as they both involve programming to the VF3 verification voltage. Finally, the "01" state may be programmed where desired by programming the "1" state until the threshold voltage is verified as being greater than VF1 (Step S1040) (Line 1100D).

While the exemplary embodiments discussed above describe a two-bit multi-level non-volatile memory device, it is to be understood that the exemplary embodiments of the present invention may be applied to a multi-level non-volatile memory device with any number of bits. For example, a three-bit multi-level non-volatile memory device may be used. The three-bit device would have 8 available memory states for each cell. These memory states may be called "111," "011," "101," "001," "110," "010," "100," and "000" respectively. The three-bit memory device, instead of having an LSB page and a MSB page, would have a first logical page, a second logical page and a third logical page. There may also be a first flag cell indicating when the second page has been programmed and a second flag cell indicating when the third page has been programmed. Alternatively, a single flag cell may be used having multiple memory states to indicate when the second page has been programmed and when the third page has been programmed. For example, the flag cell may initially be set to an unprogrammed '111' state indicating that neither second nor third data pages have been programmed, the flag cell may be programmed to a '010' state to indicate that the second data page has been loaded and the flag cell may be programmed to a '000' state to indicate that the third data page has been loaded. For embodiments where two flag cells are used, the first flag cell may be programmed to the '0' state to indicate that the second data page has been programmed and the second flag cell may be programmed to the '0' state to indicate that the third data page has been programmed. While embodiments of the present invention utilize either approach, the exemplary embodiments of the present invention are discussed in terms of the first approach for simplicity.

For embodiments where there are more than three-bits, there may be more than 8 available memory states and more than three flag cells or more than three states on a single flag cell.

FIGS. 12A-12D show a three-bit memory device according to exemplary embodiments of the present invention. Many of the details as to how to program the various cells may be understood to be analogous to the exemplary embodiments discussed herein. It should be understood that the features of these examples may be extrapolated to provide multi-bit memory devices of greater than three bits.

Figure 12A:
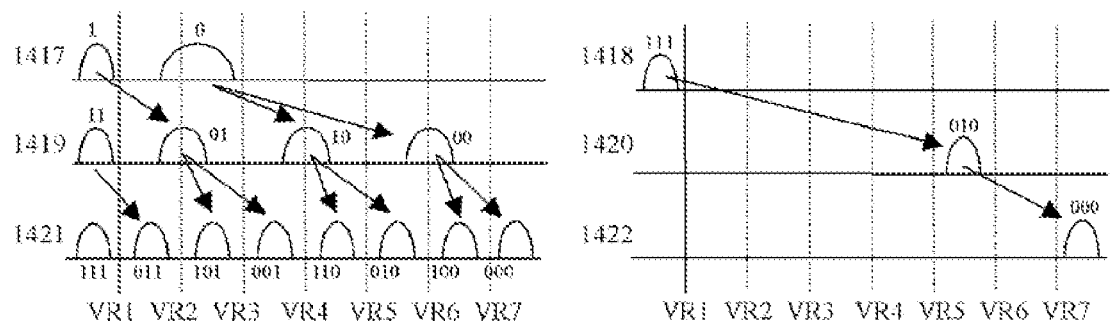
FIGS. 12A-12B show a three-bit memory device according to an exemplary embodiment of the present invention.
Figure 12B:
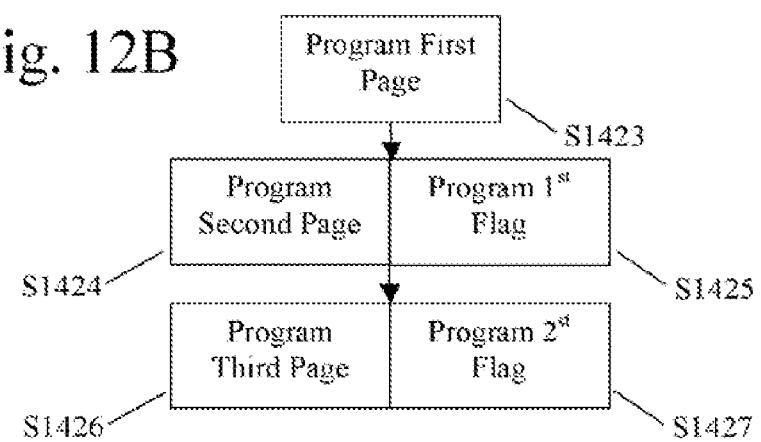
Figure 12C:
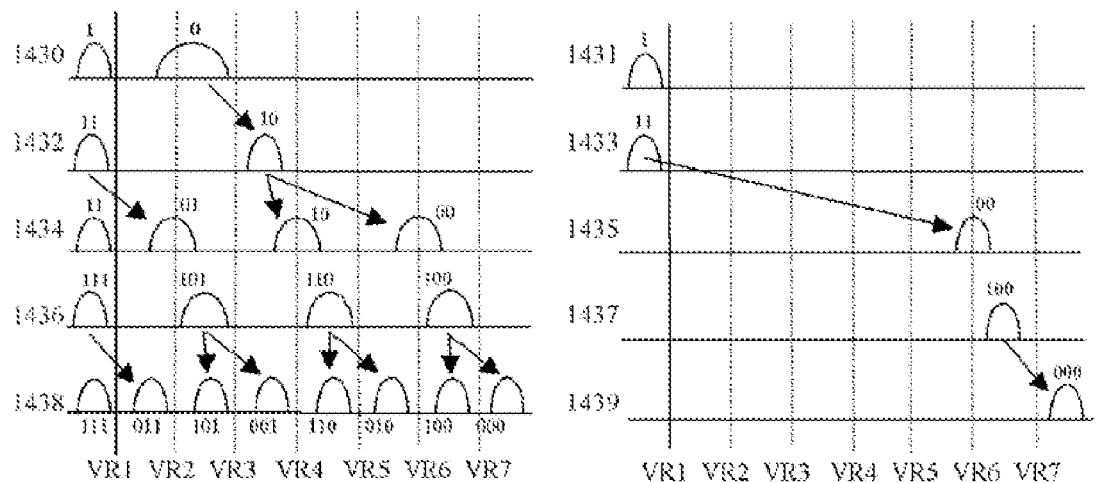
FIGS. 12C-12D show a three-bit memory device according to an exemplary embodiment of the present invention.

According to some exemplary embodiments of the present invention, the storage cells are not advanced prior to second page and third page programming. FIGS. 12A and 12B illustrate such an embodiment. With respect to FIGS. 12A and 12B, the first page may be programmed (line 1417, step S1423). The flag cell may originate in the unwritten '111' state (line 1418). Then, the second page data may be programmed (line 1419, step S1424) and the flag cell may be programmed to a level indicating that second data page has been programmed (line 1420, Step S1425). For example, the flag cell may be programmed to the '010' state. The two steps S1424 and S1425 may occur simultaneously or nearly simultaneously. The third page data may then be programmed (line 1421, step S1426) and the flag cell may be programmed to a level indicating that the third data page has been programmed (line 1422, step S1427). For example, the flag cell may be programmed to the '000' state. The two steps S1426 and S1427 may occur simultaneously or nearly simultaneously.

Figure 12D:
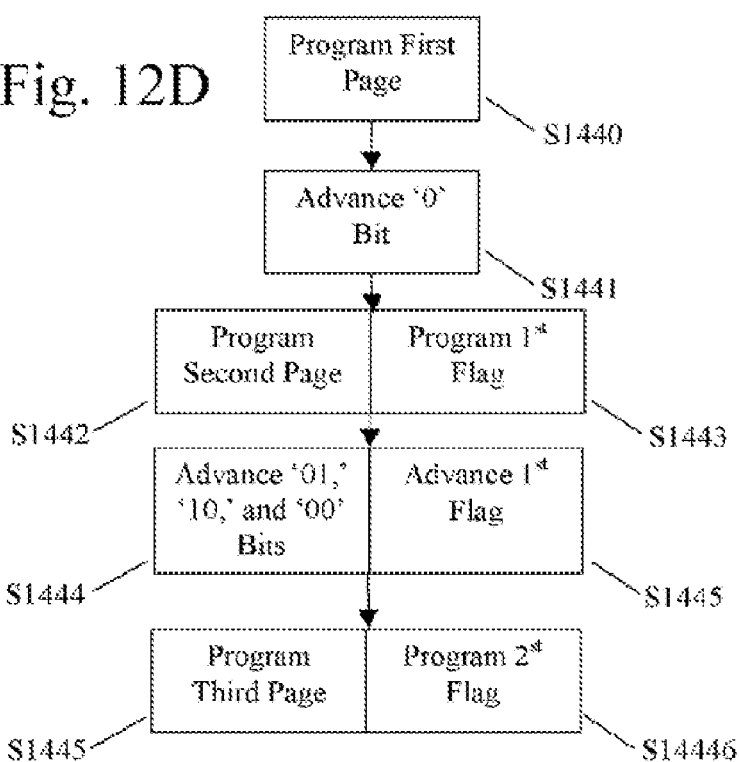
Figure 14:
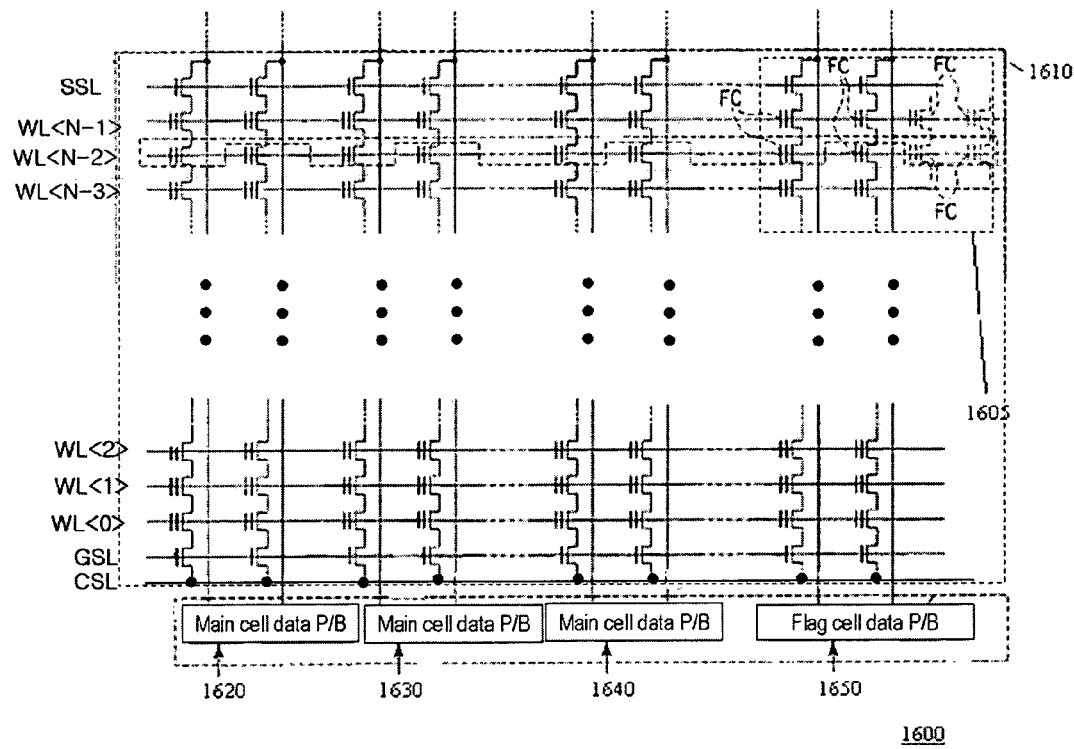
FIG. 14 is a schematic representation of a memory page according to an exemplary embodiment of the present invention.

With respect to FIGS. 12A and 12D, the first page may be programmed (line 1430, step S1440). The flag cell may originate in the unwritten '111' state (line 1431). The '0' bit may then be advanced (line 1432, step S1441) so that the first page data may be protected from data corruption in the event of an unanticipated interruption. The flag cell may remain in the '111' state (line 1433). Then, the second page data may be programmed (line 1434, step S1442) and the flag cell may be programmed to a level indicating that second data page has been programmed (line 1435, Step S1443). For example, the flag cell may be programmed to the '000' state. The two steps S1442 and S1443 may occur simultaneously or nearly simultaneously. The second page data states '01,' '10,' and '00' may then be advanced (line 1446, step S1444) so that the second page data may be protected from data corruption in the event of an unanticipated interruption. The flag cell may also be advanced from the '000' state to the '100' state (line 1437, step S1445). The third page data may then be programmed (line 1438, step S1446) and the flag cell may be programmed to a level indicating that the third data page has been programmed (line 1439, step S1447). For example, the flag cell may be programmed to the '000' state. The two steps S1446 and S1447 may occur simultaneously or nearly simultaneously.

While multi-level non-volatile memory devices may use any conceivable scheme for the programming of data cells, FIG. 13 is a table showing bias conditions for controlling a two-bit multi-level non-volatile memory device according to an exemplary embodiment of the present invention. This table shows examples of signals that may be used to erase, program, inhibit, read and verify the storage cells and flag cell according to an exemplary embodiment of the present invention.

The table in FIG. 13 summarizes voltages applied to operate the memory cell array according to an exemplary embodiment of the present invention. The top row of the table defines a set of possible memory functions that may be performed. These functions include erasing memory, programming memory, inhibiting the programming of memory, and reading LSB, MSB and flag cell data. For each desired function, the first column labels each line that may receive a voltage in the execution of the desired function. The remaining rows and columns of the table define the set of voltages that are to be applied to each of the lines listed on the first column to perform the desired function listed on the top row. The voltages may be specified in terms of a specific voltage such as 0 V or 20 V. The voltages may alternatively be specified in terms of a signal such as Vcc or Vpgm that have been described in detail above. The term "Floating" indicates that the line is not set to a particular voltage. "H or L" indicates that the line may be sent a high signal or a low signal. Vread is applied to unselected WLs when reading data, and Vpass is applied to unselected WLs when programming.

FIG. 4 is a schematic representation of a memory page according to an exemplary embodiment of the present invention. The memory page 1600 shows multiple data storage cells on multiple data storage bit lines. The data storage bit lines are controlled by a set of data storage circuits 1620, 1630, and 1640 that comprise the page buffer circuit along with the flag storage data circuit 1650 that controls bit lines associated with the flag cell 1605. The data storage cells and the flag cell comprise a data block 1610.

Figure 15:
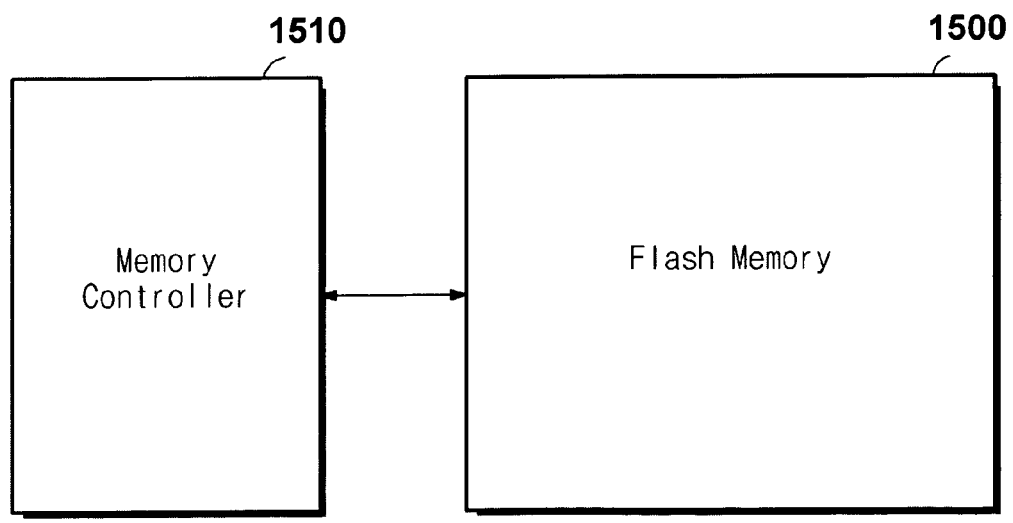
FIG. 15 shows a memory system including flash memory according to an exemplary embodiment of the present invention.

FIG. 15 shows a memory system including flash memory according to an exemplary embodiment of the present invention. Memory systems may include a flash memory 1500 and a memory controller 1510. The memory controller 1510 may control the operation of the flash memory 1500.

It is to be understood that while many of the figures show a cell having multiple threshold voltage curves, these multiple threshold voltage curves are shown for the purposes of illustrating all of the possible states and it is to be understood that any one given cell will only have one threshold voltage range at a given time. Moreover, when the disclosure discusses programming a state, it is to be understood that programming is only executed to the extent desired. Accordingly, when a process step describes programming a cell, for example, to the '00' state, this programming step is only executed when such a state is desired. It is to be understood that once the desired state has already been achieved, the cell will not be programmed to another state.

The above specific embodiments are illustrative and many variations can be introduced on these embodiments without departing from the spirit of the disclosure or from the scope of the appended claims. For example, elements and/or features of different illustrative embodiments may be combined with each other and/or substituted for each other within the scope of this disclosure and appended claims.

What is claimed is:

1. A method for programming multi-level non-volatile memory comprising at least one flag cell and a plurality of multi-bit storage cells, each of the plurality of multi-bit storage cells capable of storing different levels of charge usable to represent data, the data represented by a least significant bits (LSBs) and a most significant bits (MSBs), the method comprising:
programming the storage cells first with LSBs and then with MSBs such that each of the programmed storage cells:
has a threshold voltage lower than a voltage VR1 when it is desired that the storage cell store a first value;
has a threshold voltage greater than the voltage VR1 and lower than a voltage VR2 when it is desired that the storage cell store a second value;
has a threshold voltage greater than the voltage VR2 and lower than a voltage VR3 when it is desired that the storage cell store a third value; and
has a threshold voltage greater than a voltage VR3 when it is desired that the storage cell store a fourth value;
wherein VR1<VR2<VR3; and
programming the flag cell to have a threshold voltage greater than the voltage VR3 to indicate that the MSBs have been programmed.

2. The method of claim 1, wherein the multi-level non-volatile memory is flash memory.

3. The method of claim 2, wherein the multi-level non-volatile memory is NAND memory.

4. The method of claim 1, wherein the programming of the LSBs and the programming of the MSBs each comprise implementing an incremental step pulse program.

5. The method of claim 1, further comprising selecting one or more reference voltages for reading the data depending upon the status of the flag cell.

6. The method of claim 1, further comprising reading the flag cell at a reference voltage of VR2.

7. The method of claim 1, wherein:
VR1 is approximately equal to 0 volts;
VR2 is within the range of approximately 1 to 2 volts; and
VR3 is within the range of approximately 2.5 to 3.5 volts.

8. A controller for controlling memory according to a method for programming multi-level non-volatile memory comprising at least one flag cell and a plurality of multi-bit storage cells, each of the plurality of multi-bit storage cells capable of storing different levels of charge usable to represent data, the data represented by least significant bits (LSBs) and a most significant bits (MSBs), the method comprising:
programming the storage cells first with LSBs and then with MSB data such that each of the programmed storage cells:
has a threshold voltage lower than a voltage VR1 when it is desired that the storage cell store a first value;
has a threshold voltage greater than the voltage VR1 and lower than a voltage VR2 when it is desired that the storage cell store a second value;
has a threshold voltage greater than the voltage VR2 and lower than a voltage VR3 when it is desired that the storage cell store a third value; and
has a threshold voltage greater than a voltage VR3 when it is desired that the storage cell store a fourth value;
wherein VR1<VR2<VR3; and
programming the flag cell to have a threshold voltage greater than the voltage VR3 to indicate that the MSB data have been programmed.

9. The controller of claim 8, wherein the multi-level non-volatile memory is flash memory.

10. The controller of claim 9, wherein the multi-level non-volatile memory is NAND memory.

11. The controller of claim 8, wherein the programming of the LSB data and the programming of the MSBs data each comprise implementing an incremental step pulse program.

12. The controller of claim 8, further comprising selecting one or more reference voltages for reading the data depending upon the status of the flag cell.

13. The controller of claim 8, further comprising reading the flag cell at a reference voltage of VR2.

14. The controller of claim 8, wherein:
VR1 is approximately equal to 0 volts;
VR2 is within the range of approximately 1 to 2 volts; and
VR3 is within the range of approximately 2.5 to 3.5 volts.

15. A method for programming a multi-level non-volatile memory comprising at least one flag cell and a plurality of multi-bit storage cells, each of the plurality of multi-bit storage cells capable of storing different levels of charge usable to represent data, the data represented by a plurality of data pages, the method comprising:

sequentially programming one or more of the plurality of data pages such that each of the programmed storage cells has a threshold voltage within one of a plurality of threshold voltage ranges comprising a first range and a plurality of subsequent ranges, wherein each of the plurality of subsequent ranges is defined as being equal to or greater than a respective verify voltage, wherein each of the plurality of subsequent ranges is read at a respective read voltage, and wherein for each given subsequent range, the respective read voltage is less than the respective verify voltage by a margin M; and programming the at least one flag cell to a threshold voltage within a threshold voltage range indicative of the number of data pages that have been programmed, wherein the flag cell threshold voltage range is defined as being equal to or greater than a flag cell verify voltage, wherein the flag cell is read at a flag cell read voltage, and the flag cell read voltage is less than the flag cell verify voltage by an enhanced margin $M_{enhanced}$ that is larger than the margin M.

16. The method of claim 15 wherein the at least one flag cell is a single flag cell and wherein the single flag cell is programmed to one of a plurality of threshold voltage ranges to indicate the number of data pages that have been programmed.

17. The method of claim 15 wherein the at least one flag cell is a plurality of flag cells and wherein which of the plurality of flag cells are programmed indicates the number of data pages that have been programmed.

18. The method of claim 15, wherein the multi-level non-volatile memory is flash memory.

19. The method of claim 15, wherein the multi-level non-volatile memory is NAND memory.

20. The method of claim 15, wherein the programming of the plurality of data pages each comprise implementing an incremental step pulse program.

21. The method of claim 15, further comprising selecting one or more reference voltages for reading the data depending upon the status of the one or more flag cells.

22. A controller for controlling memory according to a method for programming multi-level non-volatile memory comprising at least one flag and a plurality of multi-bit storage cells, each of the plurality of multi-bit storage cells capable of storing different levels of charge usable to represent data, the data represented by a plurality of data pages, the method comprising:

sequentially programming one or more of the plurality of data pages such that each of the programmed storage cells has a threshold voltage within one of a plurality of threshold voltage ranges comprising a first range and a plurality of subsequent ranges, wherein each of the plurality of subsequent ranges is defined as being equal to or greater than a respective verify voltage, wherein each of the plurality of subsequent ranges is read at a respective read voltage, and wherein for each given subsequent range, the respective read voltage is less than the respective verify voltage by a margin M; and programming the at least one flag cell to a threshold voltage within a threshold voltage range indicative of the number of data pages that have been programmed, wherein the flag cell threshold voltage range is defined as being equal to or greater than a flag cell verify voltage, wherein the flag cell is read at a flag cell read voltage, and the flag cell read voltage is less than the flag cell verify voltage by an enhanced margin $M_{enhanced}$ that is larger than the margin M.

23. The controller of claim 22 wherein the at least one flag cell is a single flag cell and wherein the single flag cell is programmed to one of a plurality of threshold voltage ranges to indicate the number of data pages that have been programmed.

24. The controller of claim 22 wherein the at least one flag cell is a plurality of flag cells and wherein which of the plurality of flag cells are programmed indicates the number of data pages that have been programmed.

25. The controller of claim 22, wherein the multi-level non-volatile memory is flash memory.

26. The controller of claim 22, wherein the multi-level non-volatile memory is NAND memory.

27. The controller of claim 22, wherein the programming of the plurality of data pages each comprise implementing an incremental step pulse program.

28. The controller of claim 22, wherein the method further comprises selecting one of more reference voltages for reading the data depending upon the status of the one or more flag cells.

* * * * *